US007136141B2

(12) United States Patent
Bakker

(10) Patent No.: US 7,136,141 B2
(45) Date of Patent: Nov. 14, 2006

(54) LITHOGRAPHIC APPARATUS WITH DEBRIS SUPPRESSION, AND DEVICE MANUFACTURING METHOD

(75) Inventor: Levinus Pieter Bakker, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/743,270

(22) Filed: Dec. 23, 2003

(65) Prior Publication Data

US 2004/0179182 A1 Sep. 16, 2004

(30) Foreign Application Priority Data

Dec. 23, 2002 (EP) ................................. 02080453

(51) Int. Cl.
*G03B 27/52* (2006.01)
*G03B 27/42* (2006.01)
*G03B 27/72* (2006.01)

(52) U.S. Cl. ............................ 355/30; 355/53; 355/69

(58) Field of Classification Search .................. 355/30, 355/53, 67–71; 250/504 R, 493.1; 378/119

See application file for complete search history.

(56) References Cited

U.S. PATENT DOCUMENTS 6,232,613 B1 * 5/2001 Silfvast et al. .......... 250/504 R
6,614,505 B1 * 9/2003 Koster et al. ................. 355/30
6,714,624 B1 * 3/2004 Fornaciari et al. .......... 378/119
6,781,673 B1 * 8/2004 Moors et al. ................. 355/76
6,867,843 B1 * 3/2005 Ogushi et al. ................ 355/30
2002/0084428 A1 7/2002 Visser et al.

FOREIGN PATENT DOCUMENTS

EP 0 858 249 A1 8/1998
EP 0 957 402 A2 11/1999
EP 0 957 402 A3 3/2000
EP 1 182 510 A1 2/2002
EP 1 223 468 A1 7/2002
JP 56-116622 A 9/1981
JP 62-268048 A 11/1987
JP 8-17371 A 1/1996
KR 2002-0016564 3/2002
KR 2002-0060587 7/2002

OTHER PUBLICATIONS

Korean Office Action, (dated Oct. 31, 2005).

* cited by examiner

*Primary Examiner*—Henry Hung Nguyen
(74) *Attorney, Agent, or Firm*—Pillsbury Winthrop Shaw Pittman LLP

(57) ABSTRACT

A lithographic projection apparatus is disclosed. The apparatus includes a radiation system that includes a radiation source and an illumination system that supplies a beam of radiation, and a support structure that supports a patterning structure. The patterning structure is configured to pattern the beam of radiation according to a desired pattern. The apparatus also includes a substrate support that supports a substrate, a projection system that projects the patterned beam onto a target portion of the substrate, an electrode, and a voltage source that applies an electric field between the radiation source and the electrode to generate a discharge between the radiation source and the electrode.

27 Claims, 3 Drawing Sheets

LITHOGRAPHIC APPARATUS WITH DEBRIS SUPPRESSION, AND DEVICE MANUFACTURING METHOD

CROSS-REFERENCE TO RELATED APPLICATIONS

This application is based on and claims the benefit of priority from European Patent Application No. 02080453.0 filed on Dec. 23, 2002, the contents of which are incorporated herein by reference.

BACKGROUND OF THE INVENTION

1. Field of Invention

The present invention relates generally to the field of lithography. More specifically, the present invention relates to removal of debris from a lithographic apparatus.

2. Description of Related Art

In a lithographic apparatus, the size of features that can be imaged onto the substrate is limited by the wavelength of the projection radiation. To produce integrated circuits with a higher density of devices, and, hence, higher operating speeds, it is desirable to be able to image smaller features. While most current lithographic projection apparatus employ ultraviolet light generated by mercury lamps or excimer lasers, it has been proposed to use shorter wavelength radiation, e.g., about 13 nm. Such radiation is termed extreme ultraviolet (EUV) or soft x-ray, and possible sources include, for example, laser-produced plasma sources, discharge plasma sources, or synchrotron radiation from electron storage rings.

Some extreme ultraviolet sources, especially plasma sources, emit substantial amounts of contaminant molecules, ions, and other (fast) particles. If such particles are allowed to reach the illumination system, which is downstream of the radiation source, or further downstream in the apparatus, they can damage the delicate reflectors and/or other elements, and cause build-up of absorbing layers on the surfaces of optical elements. Such damage and built-up layers cause an undesirable loss of beam intensity, which necessitates increasing exposure times and, hence, reducing machine through-put. The built-up layers and damage can be difficult to remove or repair. To prevent contaminant particles from reaching the illumination system, it has been proposed to provide a physical barrier or window in the exit from the radiation system or the entrance to the illumination system. However, such a window is itself prone to damage from the contaminant particles and build-up of absorbing layers. Also, since most materials absorb extreme ultraviolet radiation at the wavelengths proposed for use in lithography, the window, even when new and clean, will absorb a significant proportion of the beam energy, thereby reducing throughput. This absorption can cause thermal stress in the window even leading to breakage of the window.

EP-A-0 957 402 discloses a contamination barrier which uses a hollow tube, positioned between the last solid surface of the projection system and the substrate, that is flushed with gas flowing towards the substrate to prevent contaminants emitted from the resist being deposited on the projection lens.

EP-A-1 223 468 describes a lithographic projection apparatus and device manufacturing method in which a contaminant barrier comprising an ionization device is introduced. Such an ionization device may, for example, be an electron source or a plasma generated by capacitive or inductive RF discharge or AC discharge. This is a relatively complicated solution to remove undesirable contaminants.

SUMMARY OF THE INVENTION

It is an aspect of embodiments of the present invention to provide a simple device that may be used in a lithographic projection apparatus to remove undesirable contaminants (debris) produced by the radiation source.

It is another aspect of embodiments of the invention to provide a method for removing the contaminants when using a lithographic projection apparatus.

The first aspect is achieved by providing a lithographic projection apparatus that includes a radiation system, comprising a radiation source, and an illumination system for supplying a projection beam of radiation. The apparatus also includes a support structure for supporting a patterning device, the patterning device serving to pattern the projection beam according to a desired pattern. The apparatus further includes a substrate table for holding a substrate, a projection system for projecting the patterned beam onto a target portion of the substrate, an electrode, and a voltage source for applying an electric field between the radiation source and the electrode to generate a discharge, viz. between the radiation source and the electrode.

The advantage of this solution is that, instead of using a complicated electron source or a plasma generation device (like by capacitive or inductive RF discharge or AC discharge), only an additional electrode has to be introduced in the apparatus, preferably positioned in the projection beam, and that, in a simple way, by using the electrons that are created by the source, an electron avalanche is created resulting in a ‘simple’ plasma that substantially suppresses and eliminates the introduction of debris to the rest of the apparatus. This way, the electrode is used to capture contaminant particles (debris) in the projection beam from the radiation source.

In one embodiment, the electric field that is applied in the apparatus between the radiation source LA and the electrode is a DC field. The electric field may be, for example, square-wave modulated and synchronized with the radiation source.

According to an embodiment of the invention, a lithographic apparatus is provided that includes a radiation system, comprising a radiation source, and an illumination system for supplying a projection beam of radiation. The apparatus also includes a support structure for a supporting patterning device, the patterning device serving to pattern the projection beam according to a desired pattern. The apparatus further includes a substrate table for holding a substrate, a projection system for projecting the patterned beam onto a target portion of the substrate, and an electrode. The electrode can be used for applying an electric field between the radiation source and the electrode, in order to generate a discharge between them. Preferably, the electrode is used as a cathode. The electrode may have a hollow geometry.

Embodiments of the invention provide a lithographic projection apparatus. The apparatus includes a radiation system that includes a radiation source and an illumination system that supplies a beam of radiation, and a support structure that supports a patterning structure. The patterning structure is configured to pattern the beam of radiation according to a desired pattern. The apparatus also includes a substrate support that supports a substrate, a projection system that projects the patterned beam onto a target portion of the substrate, an electrode, and a voltage source that applies an electric field between the radiation source and the electrode to generate a discharge between the radiation source and the electrode.

In another embodiment, the invention comprises a combination of a radiation system, comprising a radiation source, and an electrode in order to generate a discharge between them.

Another aspect of embodiments of the invention provides a radiation system that includes a radiation source, an electrode, and a voltage source. The voltage source applies an electric field between the radiation source and the electrode, and generates a discharge between the radiation source and the electrode to capture contaminant particles from the radiation source.

In another embodiment, the apparatus further comprises a contaminant barrier (e.g. described in WO 02/054153) (sometimes also called 'foil trap' or 'trap') downstream, relative to the direction of propagation of said projection beam, of said radiation system and additional electrode. The apparatus may further comprise a contaminant barrier, wherein the contaminant barrier is the electrode itself and is used as such. This means that the contaminant barrier is present as an electrically insulated part of the apparatus. Hence, at least one embodiment of the invention also comprises a combination of a radiation system, comprising a radiation source, and a contaminant barrier as an electrode for applying an electric field and generating an extra discharge between the radiation source and the contaminant barrier. Also, these embodiments lead to the above mentioned advantages of the invention.

It can be helpful to improve the confinement of the electrons by positioning a magnetic field generator for applying an axial magnetic field, wherein the Lorentz force on moving electrons can help confine the electrons between the source and the additional electrode. This results in a higher electron and ion density in the volume between the radiation source and the electrode. In a further embodiment, the ionization effect by the electric field, between the additional electrode and the radiation source, can be improved by providing a magnetic field generator applying an axial magnetic field between the source and the additional electrode.

In another embodiment, a gas is provided in a region traversed by said projection beam. The gas preferably comprises an EUV transparent (noble) gas, e.g., one or more of He, Ar, $N_2$ or $H_2$, by a gas supply unit constructed and arranged to provide such gas in said region traversed by the projection beam. Optionally, an outlet positioned upstream, relative to the direction of propagation of the projection beam, of this gas supply unit can be included in the lithographic apparatus of the invention, for removing said gas from said region traversed by said projection beam, and for creating a gas flow being substantially directed in the opposite direction to the direction of propagation of contaminant particles.

According to a further aspect of the invention, there is provided a method for debris suppression of an ionizing radiation system, comprising a radiation source of ultraviolet or extreme ultraviolet radiation, for example, having a wavelength of about 157 or 126 nm, or in the range of about 8 to 20 nm, characterized by providing an electrode positioned downstream, relative to the direction of propagation of the projection beam, of the radiation system, and applying an electric field between the radiation source and the electrode to generate a discharge between the radiation source and the electrode.

In another embodiment of the invention, there is provided a device manufacturing method using a lithography apparatus comprising providing a radiation system, comprising a radiation source, and an illumination system, for supplying a projection beam of radiation; providing a support structure for supporting a patterning device, the patterning device serving to pattern the projection beam according to a desired pattern; providing a substrate table for holding a substrate; and providing a projection system for projecting the patterned beam onto a target portion of the substrate, characterized by providing an electrode positioned downstream, relative to the direction of propagation of the projection beam, of the radiation system and applying an electric field between the radiation source and the electrode to generate a discharge between the radiation source and the electrode.

Embodiments of the invention also provide a device manufacturing method using a lithographic apparatus. The method includes providing a beam of radiation with a radiation source, patterning the beam of radiation, projecting the patterned beam onto a target portion of a substrate, providing an electrode positioned downstream, relative to a direction of propagation of the beam of radiation, of the radiation source, and applying an electric field between the radiation source and the electrode to generate a discharge between the radiation source and the electrode.

In another embodiment, a method for debris suppression of an ionizing radiation system in provided. The method includes providing a radiation source, providing an electrode, and applying an electric field between the radiation source and the electrode generate a discharge between the radiation source and the electrode.

Embodiments of the invention also include a device manufactured by the apparatus or manufactured according to the method, as described above.

BRIEF DESCRIPTION OF THE DRAWINGS

Embodiments of the invention will be illustrated with reference to the following drawings that are only intended to illustrate the invention and not to limit its scope, in which.

DETAILED DESCRIPTION OF EMBODIMENTS OF THE INVENTION

Figure 1:
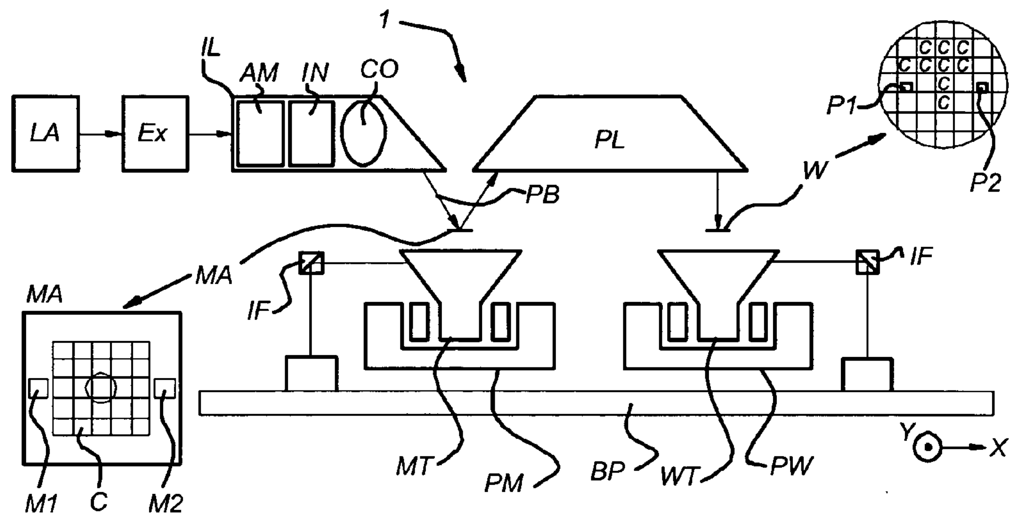
FIG. 1 depicts schematically a lithographic projection apparatus of embodiments of the invention.

The term "patterning device" or "patterning structure" as here employed should be broadly interpreted as referring to a device or structure that can be used to endow an incoming radiation beam with a patterned cross-section, corresponding to a pattern that is to be created in a target portion of the substrate. The term "light valve" can also be used in this context. Generally, the said pattern will correspond to a particular functional layer in a device being created in the target portion, such as an integrated circuit or other device (see below).

Examples of Such Patterning Devicees Include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronic devices. In both of the situations described here above, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as here above set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go. Such an apparatus is commonly referred to as a wafer stepper or step and repeat apparatus. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti parallel to this direction. Since, in general, the projection system will have a magnification factor M (generally $<1$), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices, the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms “reticle”, “wafer” or “die” in this text should be considered as being replaced by the more general terms “mask”, “substrate” and “target portion”, respectively.

In the present document, the terms “radiation” and “beam” are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams, but in particular only these types of radiation that create (photo)electrons.

Some embodiments of the invention will now be described in more detail, by way of example only, with reference to the accompanying schematic drawings in which corresponding reference symbols indicate corresponding parts.

Embodiment 1

FIG. 1 schematically depicts a lithographic projection apparatus 1 according to a particular embodiment of the invention. The apparatus comprises a radiation system comprising a beam expander Ex, and an illumination system IL, for supplying a projection beam PB of radiation (e.g. EUV radiation). In this particular case, the radiation system also comprises a radiation source LA. A first object table (mask table) MT is provided with a mask holder for holding a mask MA (e.g. a reticle), and connected to a first positioning device PM for accurately positioning the mask with respect to item PL. A second object table (substrate table) WT is provided with a substrate holder for holding a substrate W (e.g. a resist coated silicon wafer), and connected to a second positioning device PW for accurately positioning the substrate with respect to item PL. The apparatus also includes a projection system (“lens”) PL (e.g. refractive, catadioptric or reflective system) for imaging an irradiated portion of the mask MA onto a target portion C (e.g. comprising one or more dies) of the substrate W. The term table as used herein can also be considered or termed as a support. It should be understood that the term support or table broadly refers to a structure that supports, holds, or carries a substrate.

As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above, and may have other optical devices, etc., than shown in this schematic drawing.

LA comprises a radiation source (see also FIG. 2), e.g. a laser-produced plasma source, a discharge plasma source, or an undulator or wiggler provided around the path of an electron beam in a storage ring or synchrotron, and produces a beam of radiation. This beam is fed into an illumination system (illuminator) IL, either directly or after having a traversed conditioning device, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross section.

The beam PB subsequently intercepts the mask MA, which is held on a mask table MT. Having traversed the mask MA, the beam PB passes through the lens PL, which focuses the beam PB onto target portion C of the substrate W. With the aid of the second positioning device PW (and an interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus), the mask table MT may just be connected to a short stroke actuator, or may be fixed. Mask MA and substrate W may be aligned using mask alignment marks M1, M2 and substrate alignment marks P1, P2.

In general, the lithographic projection apparatus comprises a radiation system constructed and arranged to supply a projection beam of radiation; a first object table constructed to hold a mask; a second object table constructed to hold a substrate; and a projection system constructed and arranged to image an irradiated portion of the mask onto a target portion of the substrate.

The depicted apparatus can be used in two different modes:

1. In step mode, the mask table MT is kept essentially stationary, and an entire mask image is projected in one go (i.e. a single “flash”) onto a target portion C. The substrate table WT is then shifted in the x and/or y directions so that a different target portion C can be irradiated by the beam PB; and
2. In scan mode, essentially the same scenario applies, except that a given target portion C is not exposed in a single “flash”. Instead, the mask table MT is movable in a given direction (the so called “scan direction”, e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The radiation system, comprising a radiation source LA and illumination system IL, and the projection system PL may each be contained in respective compartments (“boxes”) which are evacuated or flushed with a gas transparent to the radiation of the projection beam. The projection beam is passed between the different compartments through openings in their walls. An example of an arrangement for passing the projection beam PB from the radiation source LA to illumination system IL is shown in greater detail in FIG. 2.

Figure 2:
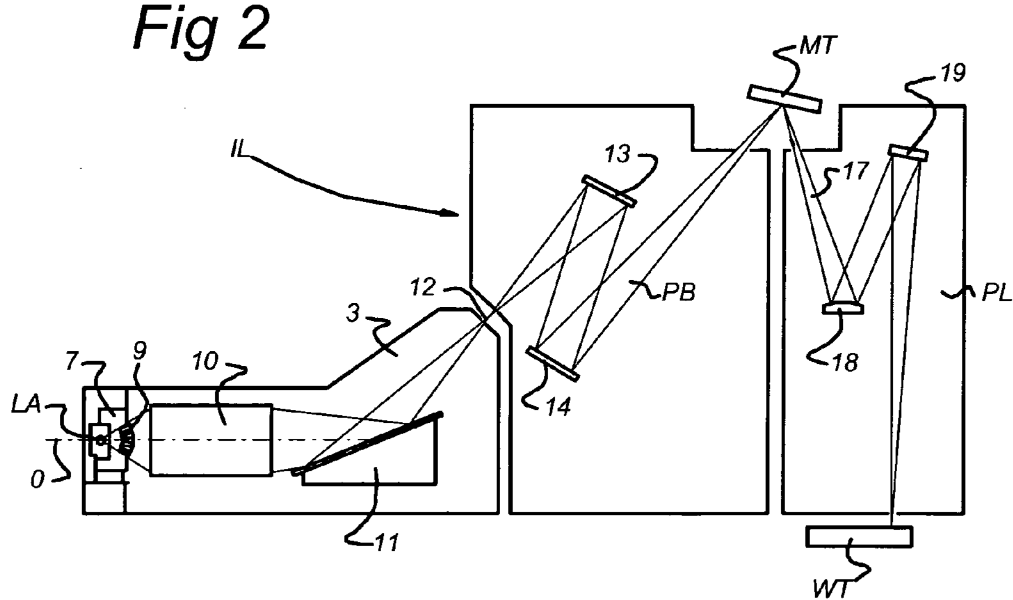
FIG. 2 shows a side view of an EUV illumination system and projection optics of a lithographic projection apparatus according to FIG. 1.

FIG. 2 shows an embodiment of the lithographic projection apparatus 1 of FIG. 1, comprising a radiation system 3 (i.e. “source-collector module”), an illumination system IL, and a projection system PL. The radiation system 3 is provided with radiation source LA which may comprise a discharge plasma source. The radiation source LA may employ a gas or vapor, such as Xe gas or Li vapor in which a very hot plasma can be created by a discharge between electrodes of the radiation source to emit radiation in the EUV range of the electromagnetic spectrum. The very hot plasma is created by causing a partially ionised plasma of an electrical discharge to collapse onto an optical axis 0. Partial pressures of 0.1 mbar of Xe gas, Li vapor, or any other suitable gas or vapor may be required for efficient generation of the radiation.

When xenon is used, the plasma may radiate in the EUV range around 13.5 nm. For an efficient EUV production, a typical pressure of about 0.1 mbar is required near the electrodes of the radiation source. A drawback of having such a relatively high Xe pressure is that Xe gas absorbs EUV radiation. For example, 0.1 mbar Xe transmits over 1 m about only 0.3% EUV radiation of a wavelength of 13.5 nm. It is therefore required to confine the rather high Xe pressure to a limited region around the source, e.g. by a "contaminant barrier". Hence, in this embodiment, the radiation emitted by the radiation source LA is passed from a source chamber 7 to a contaminant barrier 9. The contaminant barrier 9 preferably comprises a channel structure such as, for example, the structure described in detail in European patent application EP-A-1 057 079, which is incorporated herein by reference.

The radiation system 3 (i.e. "source-collector module") comprises a radiation collector 10 which may be formed by a grazing incidence collector. Radiation passed by the radiation collector 10 is reflected off a grating spectral filter 11 or mirror to be focused in a virtual source point 12 at an aperture. The projection beam PB is reflected in the illumination system IL via normal incidence reflectors 13, 14 onto a reticle or mask positioned on reticle or mask table MT. A patterned beam 17 is formed, which is imaged in projection optics system PL via reflective elements 18, 19 onto wafer stage or substrate table WT. More elements than shown may generally be present in illumination system IL and projection system PL.

Figure 3:
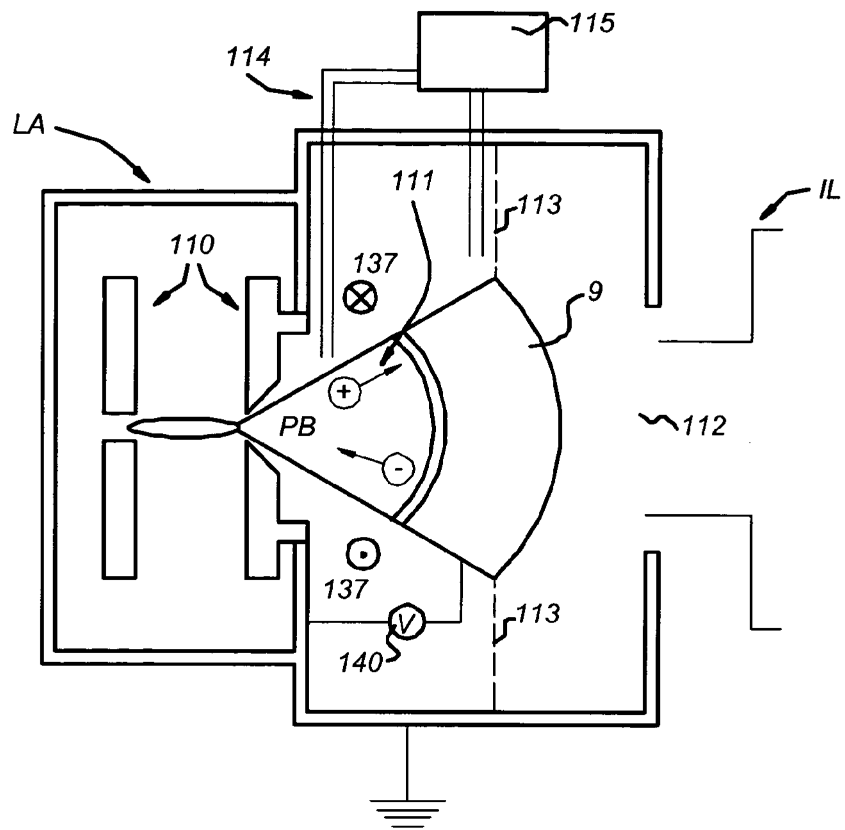
FIG. 3 shows a contaminant barrier as electrode according to an embodiment.

FIG. 3 shows schematically part of the lithographic projection apparatus according to FIG. 2. As well as the projection beam PB of desired radiation, the radiation source LA, i.e. the discharge creating electrodes 110 within the radiation source LA, emits a beam of contaminant particles 111, particularly if a discharge or laser-produced plasma source is used. The contaminant particle beam 111 unavoidably travels with the projection beam PB and must be prevented from entering the illumination system IL through aperture(s) 112. To this end, a contaminant barrier 9 is arranged downstream from radiation source LA. The illumination system IL is evacuated to reduce absorption of the projection beam PB. The contaminant barrier 9 is electrically insulated 113 from the rest of the apparatus and an electric field E is applied between the radiation source LA and the contaminant barrier 9 by a voltage source 140.

EUV photons emitted by the radiation source are partly absorbed by a buffer gas that is present in the space between the radiation source and the contaminant barrier 9, thereby creating ions and free electrons. Photons impinging on the contaminant barrier 9 will also create secondary electrons. All of these electrons can be accelerated by electric field E. The accelerated electrons then produce an electron avalanche (by electron impact ionization), creating more electrons and ions. In this relative simple way, a gas discharge is sustained with a charged particle density larger than in the case without an electric field. The avalanche process can be relatively fast, so modulation of the degree of ionization on a fast time-scale is possible. The presence of ions in the ionized gas leads to an increased probability for collisions of charged debris particles with particles in the ionized gas, since cross sections for charged particle collisions are much larger than for collisions of neutral particles with charged particles.

When using the contaminant barrier 9 (electrode) as a cathode, other positively charged particles are drawn to the contaminant barrier, which is also used as a getter. Collisions of these particles might lead to the emission of extra secondary electrons. Furthermore, the additional discharge can ionize the neutral debris emitted by the radiation source, and redirect it electromagnetically away from the beam. This way, the buffer gas stops even neutral debris. A kind of simple plasma is created, suppressing unwanted debris and diminishing damage to optical parts in the apparatus. In this way, a simple means for debris suppression is provided. Typically, the distance between this electrode and the radiation source (in this embodiment electrodes 110, especially the grounded electrode), where debris or charged particles are created, is between about 1 and 50 cm, e.g., about 10 cm.

To improve the ionization of the gas, a magnetic trap, e.g. one formed by coils 137, may optionally be provided to generate an (axial) magnetic field between the source LA and the contaminant barrier 9, which traps, by means of a Lorentz force, free electrons increasing the ionization of any gas moving towards the clean side of the contaminant barrier 9. Damage to and deposition on optical elements, e.g. mirrors 13,14, in the illumination system IL are thereby avoided. The coils 137 can comprise a number of coils.

The electric field E that is applied in the apparatus between the radiation source LA and the contaminant barrier 9 is in one embodiment a DC field. The electric field E between the radiation source and the additional electrode may have a voltage difference up to about 1000 V. The electric field E can be square-wave modulated and synchronized with the radiation source LA. Since the avalanche of electrons can be relatively fast, such a modulation on a fast time scale is possible. Higher voltages will usually be avoided, since they could result in electrical breakdown towards the illuminator.

In FIG. 3, the voltage source 140 is shown to be connected to the contaminant barrier 9. However, in general, any type of electrode connected to the voltage source 140 may be provided to produce the desired electric field E between such an electrode and radiation source LA. In accordance with FIG. 3, the electrode will also be referred to with reference number 9.

The volume between radiation source LA and contaminant barrier 9 is well suited for the introduction of an additional electrode for applying an electric field between the radiation source LA and the electrode and to generate an extra discharge between the radiation source LA and the electrode. The local pressure is relatively high, and the volume is relatively well encapsulated. In this way, an extra discharge or 'simple' plasma is created. However, it might be desirable for maintaining and sustaining a sufficient ionization and discharge between the radiation source LA and the additional electrode in the apparatus, to provide extra gas in a region traversed by the projection beam. Preferably, the gas is a noble gas, more preferably, said noble gas is He or Ar, or the gas is another EUV transparant gas like $N_2$ or $H_2$. The total pressure of the noble gas(ses) in this region is preferably at maximum equal to the source pressure, in order to circumvent too much gas flowing into the radiation source LA. Hence, the invention comprises also an embodiment in which extra gas is provided in a region traversed by the projection beam in the region between the source and the additional electrode, preferably wherein a pressure is maintained which at maximum is equal to the source pressure, and preferably with a means for adjusting and/or maintaining this pressure. A typical pressure of a Xe-discharge source is about 0.1 mbar, hence the pressure in said region may be maintained at about 0.1 mbar. In such an embodiment, the apparatus may also comprise a gas supply unit 115, for providing said gas in the region between the source and the additional electrode.

In another embodiment, the apparatus according to the invention may further comprise a gas supply unit 115 constructed and arranged to provide a flow of said gas in said region traversed by the projection beam, said gas flow being substantially directed in the opposite direction to the direction of propagation of contaminant particles. The apparatus may comprise an outlet 114 which is positioned upstream, relative to the direction of propagation of the projection beam PB, of the gas supply unit 115 for removing the gas from the region traversed by the projection beam PB, and maintaining the required pressure. For example, the outlet 114 can be close to the radiation system LA. The gas effectively impedes the contaminants traveling with the projection beam. Hence, embodiments of the invention also comprise a method in which a gas is provided in the region between the radiation source LA and the electrode, as described above. The outlet 114 can be positioned in such a way, that on the one hand a stream is maintained in the opposite direction of the direction of propagation of the projection beam, but on the other hand it is prevented that the stream of gas is fully directed into the source.

Preferably, the electrode 9 downstream of the radiation source LA is negatively charged (a cathode) with respect to radiation source LA. This is advantageous since electrons are then kept away from the rest of the apparatus, and a discharge towards the illuminator is less likely to occur than for a positively charged electrode. Furthermore, by having a negatively charged electrode, one can make use of the electrons freed from the electrode.

In case of a radiation source LA comprising electrodes 110 (like a plasma discharge source, see e.g. FIG. 3), the negatively charged electrode of the radiation source LA reaches rather high (negative) voltages. Hence, it is preferable to define the voltage of the electrode 9 relative to the ground (i.e. grounding the right electrode of the radiation source LA in the example of FIG. 3), and the electric field should thus be directed towards the extra electrode. The apparatus of the invention preferably comprises a laser-produced, or discharge, plasma radiation source as radiation system. The apparatus of the invention is in particular useful for (extreme) ultraviolet radiation, e.g. said radiation with a wavelength of 157, 126 nm, or in the range of from 8 to 20 nm, especially 9 to 16 nm. However, the invention is not restricted to these ranges and wavelengths.

As mentioned above, the electric field E that is used can be square-wave modulated and synchronized with the radiation source LA. A useful scheme could be to have no potential on the electrode during the discharge of the radiation source LA, and to switch on the voltage on the electrode just after the source plasma in the radiation source LA has extinguished. Then, the influence of the voltage of the electrode on the source plasma in the radiation source LA is minimized, while the fast ions, leaving radiation source LA towards contaminant barrier 9 are still slowed down, since it takes them some time to move through the gas between the radiation source LA and contaminant barrier 9. The modulation frequency of the radiation systems is usually found at few kHz for lasers and Xe discharge sources.

Embodiment 2

Figure 4:
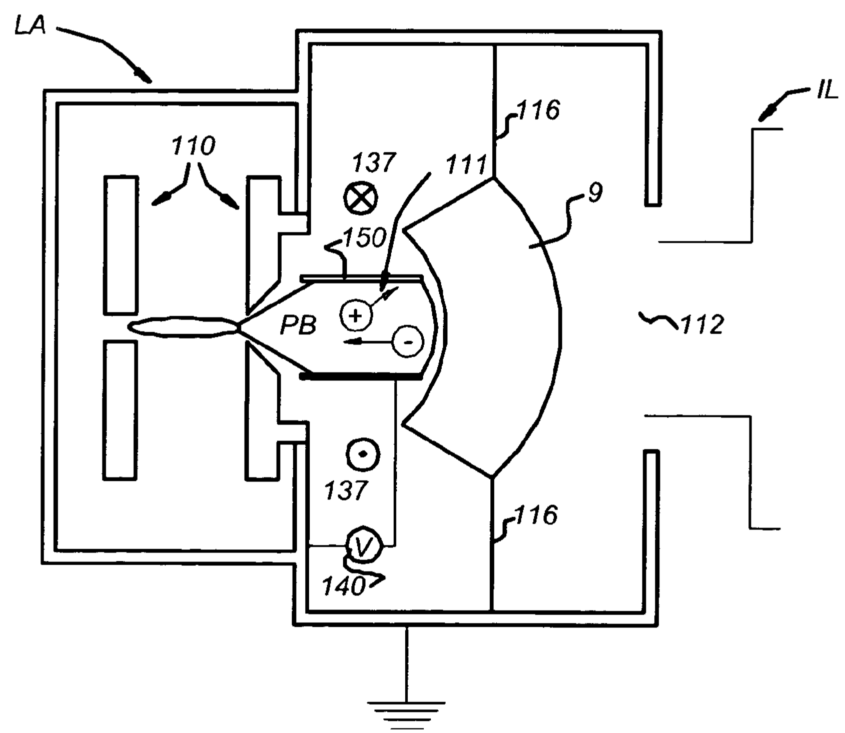
FIG. 4 shows a hollow cathode geometry and contaminant barrier according to another embodiment.

As mentioned above, in general, any type of electrode connected to the voltage source 140 may be provided to produce the desired electric field E between such an electrode and radiation source LA. An example is shown in a second embodiment, wherein the additional discharge between radiation source LA and contaminant barrier 9 is provided by separate electrode 150. Then, the electrode may be a cylinder 150, preferably used as a cathode, as shown in FIG. 4. The hollow cathode 150 is connected to a voltage source 140. This geometry is also beneficial in combination with a contaminant barrier 9, since the electric field, generated between hollow electrode 150 and radiation source LA can direct ionized electrode material, coming from radiation source LA, away from the projection beam PB, i.e. direct it towards platelets of the contaminant barrier 9. Since an additional electrode (150) is introduced, unlike the embodiment described in FIG. 3, it is no longer necessary that the contaminant barrier 9 be electrically insulated 116 from the rest of the apparatus. The additional electrode (150) can have different geometries, e.g. it might also have a conical shape, with surfaces more or less parallel to the projection beam.

This embodiment is not limited to the schematic drawing in FIG. 4. For example, this embodiment may also optionally comprise a magnetic trap to generate an (axial) magnetic field between the source LA and electrode 150 and, therefore, coils 137 may be provided. These coils 137, schematically drawn here, may comprise a number of coils, and can be arranged in different ways. For example, coils 137 can be positioned on one or both sides of the hollow electrode 150. It may further comprise a gas supply unit, as described above, for introducing gas or for maintaining a gas stream.

Embodiment 3

Figure 5:
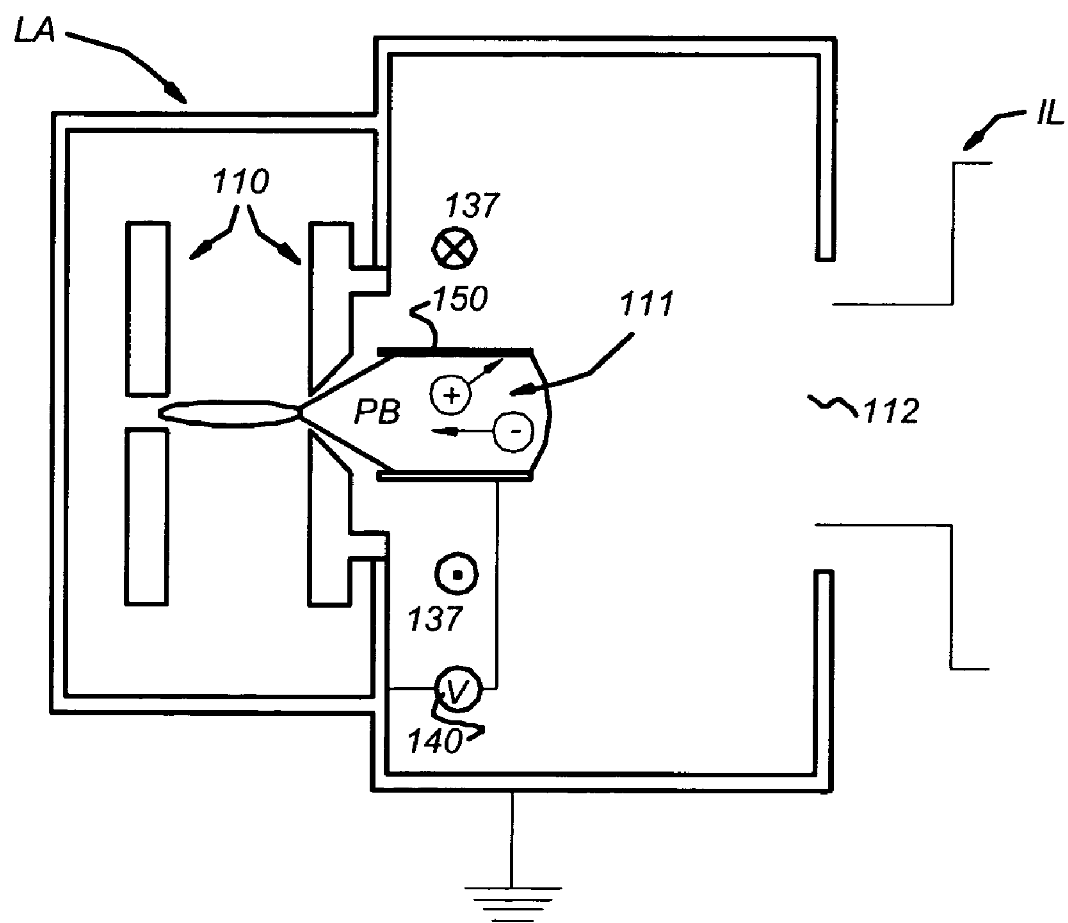
FIG. 5 shows a hollow cathode geometry according to a further embodiment.

FIG. 5 depicts another embodiment, similar to the previous one, but without the contaminant barrier 9. This embodiment is based on the insight that the ionization energy of electrode materials of the radiation source LA, like molybdenum and tungsten, is much lower than the ionization energy of noble gases as argon, helium and xenon. Therefore, when molybdenum and tungsten atoms are present in a gas discharge, the ions will be efficiently ionized. It might even be possible to ionize all the sputtered electrode material of radiation source LA within the extra discharge, caused by the electric field E between radiation source LA and electrode 150, and to collect it electromagnetically on the electrode that acts as a getter. Thus, if total ionization of debris is possible, contaminant barrier 9 may not be necessary anymore.

Also this embodiment is not limited to the schematic drawing of this embodiment in FIG. 5. For example, this embodiment may also optionally comprise a magnetic trap to generate an (axial) magnetic field between the source LA and electrode 150. It may further comprise a gas supply unit, as described above, for introducing gas or for maintaining a gas stream.

The apparatus of the present invention may further comprise an extra contamination barrier like the one described in EP-A-0 957 402, or an extra contaminant barrier comprising an ionization device, for example, by an electron source, or a plasma generated by capacitive or inductive RF, or AC discharge, according to EP-A-1 223 468.

While specific embodiments of the invention have been described above, it will be appreciated that the invention may be practiced otherwise than as described. The description is not intended to limit the invention.

What is claimed is:

1. A lithographic projection apparatus comprising:

a radiation system, comprising a radiation source, and an illumination system that supplies a beam of radiation;

a support structure that supports a patterning structure, the patterning structure configured to pattern the beam of radiation according to a desired pattern;

a substrate support that supports a substrate;

a projection system that projects the patterned beam onto a target portion of the substrate;

an electrode; and a voltage source connected to the radiation source and the electrode and configured to apply an electric field between the radiation source and the electrode to generate a discharge between the radiation source and the electrode.

2. The apparatus according to claim 1, wherein the electrode is positioned in the beam of radiation.

3. The apparatus according to claim 1, further comprising a contaminant barrier disposed downstream, relative to the direction of propagation of the beam of radiation, of said radiation source.

4. The apparatus according to claim 1, wherein said electrode is a contaminant barrier disposed downstream, relative to the direction of propagation of the beam of radiation, of said radiation source.

5. The apparatus according to claim 1, wherein said electrode is a cathode.

6. The apparatus according to claim 5, wherein the cathode is a hollow cathode.

7. The apparatus according to claim 1, wherein said voltage source is arranged to generate a DC field.

8. The apparatus according to claim 1, wherein said voltage source is arranged to generate a square-wave modulated electric field that is synchronized with the radiation source.

9. The apparatus according to claim 1, wherein a magnetic field generator is provided to apply an axial magnetic field between said radiation source and said electrode.

10. The apparatus according to claim 1, wherein a gas is provided in a region traversed by said beam of radiation.

11. The apparatus according to claim 10, wherein the gas comprises an extreme ultra-violet transparent gas.

12. The apparatus according to claim 11, wherein the extreme ultra-violet transparent gas comprises at least one of He, Ar, $N_2$, and $H_2$.

13. The apparatus according to claim 10, further comprising a gas supply unit constructed and arranged to provide said gas in said region traversed by the projection beam.

14. The apparatus according to claim 13, further comprising an outlet positioned upstream, relative to the direction of propagation of the beam of radiation, of the gas supply unit to remove said gas from said region traversed by said beam of radiation, and to create a gas flow being substantially directed in an opposite direction to a direction of propagation of contaminant particles.

15. The apparatus according to claim 1, comprising a laser-produced, or discharge, plasma radiation source.

16. The apparatus according to claim 1, wherein said beam of radiation comprises a wavelength of about 157 nm or about 126 nm.

17. The apparatus according to claim 1, wherein said beam of radiation comprises a wavelength from about 8 nm to about 20 nm.

18. The apparatus according to claim 17, wherein said beam of radiation comprises a wavelength from about 9 nm to about 16 nm.

19. A radiation system, comprising:

a radiation source;

an electrode; and a voltage source connected to the radiation source and the electrode, wherein the voltage source applies an electric field between the radiation source and the electrode, and generates a discharge between the radiation source and the electrode to capture contaminant particles from said radiation source.

20. The radiation system according to claim 19, further comprising a contaminant barrier.

21. A device manufacturing method using a lithography apparatus, the method comprising:

providing a beam of radiation with a radiation source;

patterning the beam of radiation;

projecting the patterned beam onto a target portion of a substrate;

providing an electrode positioned downstream, relative to a direction of propagation of the beam of radiation, of the radiation source;

connecting a voltage source to the radiation source and the electrode; and applying an electric field between the radiation source and the electrode to generate a discharge between the radiation source and the electrode.

22. The method according to claim 21, wherein the electric field is a DC field.

23. The method according to claim 21, wherein the electric field is square-wave modulated and synchronized with the radiation system.

24. The method according to claim 21, wherein the electrode is a contaminant barrier.

25. The method according to claims 21, wherein the electric field between the radiation source and the electrode has a voltage difference up to about 1000 V.

26. The method according to claim 21, further comprising providing a gas in the region between the radiation source and the electrode.

27. A method for debris suppression of an ionizing radiation system, comprising:

providing a radiation source;

providing an electrode downstream, relative to a direction of propagation of the beam of radiation, of the radiation source;

connecting a voltage source to the radiation source and the electrode; and applying an electric field between the radiation source and the electrode to generate a discharge between the radiation source and the electrode.

* * * * *